(12) United States Patent
Furusawa et al.

(10) Patent No.: US 11,515,281 B2
(45) Date of Patent: Nov. 29, 2022

(54) BONDED STRUCTURE AND BONDING MATERIAL

(71) Applicant: Panasonic Corporation, Osaka (JP)

(72) Inventors: Akio Furusawa, Osaka (JP); Shinji Ishitani, Hyogo (JP); Kiyohiro Hine, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 332 days.

(21) Appl. No.: 16/846,522

(22) Filed: Apr. 13, 2020

(65) Prior Publication Data

US 2020/0335470 A1 Oct. 22, 2020

(30) Foreign Application Priority Data

Apr. 22, 2019 (JP) .............................. JP2019-080878
Mar. 5, 2020 (JP) .............................. JP2020-038081

(51) Int. Cl.
*H01L 23/00* (2006.01)
*B23K 35/02* (2006.01)
(Continued)

(52) U.S. Cl.
CPC .......... *H01L 24/29* (2013.01); *B23K 35/0244* (2013.01); *B23K 35/262* (2013.01);
(Continued)

(58) Field of Classification Search
CPC ..................... H01L 24/29; H01L 24/83; H01L 2224/29209; H01L 2224/29211; H01L 2224/29213; H01L 2224/29218; H01L 2224/2922; H01L 2224/29239; H01L 2224/29247; H01L 2224/29255; H01L 2224/2926; H01L 2224/83815; H01L 2924/01026; H01L 2924/01028; H01L 2924/01029; H01L 2924/0103; H01L 2924/01047; H01L 2924/01049; H01L 2924/0105; H01L 2924/01051; H01L 2924/01083; H01L 2924/014; H01L 2224/02; H01L 2224/04; B23K 35/0244;
(Continued)

(56) References Cited

U.S. PATENT DOCUMENTS 7,955,411 B2 * 6/2011 Yasuda ................... H01L 24/83
428/548
9,381,595 B2 * 7/2016 Yasui ..................... C22C 1/0483
(Continued)

FOREIGN PATENT DOCUMENTS

JP 5620122 11/2014
JP 5986929 9/2016
JP 2018-59192 4/2018

*Primary Examiner* — Allen L Parker
*Assistant Examiner* — David W Houston, III
(74) *Attorney, Agent, or Firm* — Wenderoth, Lind & Ponack, L.L.P.

(57) ABSTRACT

There is provided a bonding material which forms a bonding portion between two objects, which material contains (1) first metal particles comprising a first metal and having a median particle diameter in the range of 20 nm to 1 μm, and (2) second metal particles comprising, as a second metal, at least one alloy of Sn and at least one selected from Bi, In and Zn and having a melting point of not higher than 200° C.

16 Claims, 8 Drawing Sheets

(51) Int. Cl.
*B23K 35/26* (2006.01)
*B23K 35/30* (2006.01)
(52) U.S. Cl.
CPC ............ *B23K 35/302* (2013.01); *H01L 24/83* (2013.01); *H01L 2224/2922* (2013.01); *H01L 2224/2926* (2013.01); *H01L 2224/29209* (2013.01); *H01L 2224/29211* (2013.01); *H01L 2224/29213* (2013.01); *H01L 2224/29218* (2013.01); *H01L 2224/29239* (2013.01); *H01L 2224/29247* (2013.01); *H01L 2224/29255* (2013.01); *H01L 2224/83815* (2013.01); *H01L 2924/0103* (2013.01); *H01L 2924/014* (2013.01); *H01L 2924/0105* (2013.01); *H01L 2924/01026* (2013.01); *H01L 2924/01028* (2013.01); *H01L 2924/01029* (2013.01); *H01L 2924/01047* (2013.01); *H01L 2924/01049* (2013.01); *H01L 2924/01051* (2013.01); *H01L 2924/01083* (2013.01)

(58) Field of Classification Search
CPC .. B23K 35/262; B23K 35/302; B23K 3/0623; B23K 3/0638; B23K 9/1093; B23K 15/0073; B05D 2430/00
USPC ........................................................ 228/246
See application file for complete search history.

(56) References Cited

U.S. PATENT DOCUMENTS

| | | | |
|---|---|---|---|
| 2005/0139644 A1* | 6/2005 | Brese | B23K 35/025 228/248.1 |
| 2005/0276934 A1* | 12/2005 | Fukui | H05K 3/3478 428/32.6 |
| 2013/0087605 A1* | 4/2013 | Kubota | B23K 35/3613 228/256 |
| 2013/0265735 A1* | 10/2013 | Nakatani | C09D 11/52 252/514 |
| 2013/0323529 A1 | 12/2013 | Kurita et al. | |
| 2014/0312285 A1* | 10/2014 | Takesue | H01L 24/83 252/514 |
| 2016/0121432 A1* | 5/2016 | Watanabe | B23K 35/365 148/24 |
| 2016/0121434 A1* | 5/2016 | Yasui | C22C 1/0483 174/257 |
| 2017/0243849 A1* | 8/2017 | Sasaki | B23K 35/025 |
| 2018/0036798 A1* | 2/2018 | Washizuka | B23K 35/025 |
| 2019/0283129 A1 | 9/2019 | Endoh et al. | |
| 2022/0053647 A1* | 2/2022 | Ejiri | H05K 3/282 |

\* cited by examiner

FIG. 6

Table 1

| | first metal particles (Cu) | | second metal particles (Sn-50% by mass In) | melting temperature | | bonding strength | |
|---|---|---|---|---|---|---|---|
| | median particle diameter | mixing ratio | median particle diameter | | | | |
| | nm | % by mass | μm | °C | evaluation | MPa | evaluation |
| Example 1 | 40 | 50 | 30 | 405 | ◎ | 8.5 | ◎ |
| Example 2 | 200 | 36 | 15 | 302 | ○ | 8.3 | ◎ |
| Example 3 | 20 | 50 | 25 | 401 | ◎ | 9.2 | ◎ |
| Example 4 | 300 | 60 | 10 | 647 | ◎ | 8.1 | ◎ |
| Example 5 | 1000 | 70 | 35 | 652 | ◎ | 6.0 | ○ |
| Example 6 | 50 | 45 | 15 | 370 | ○ | 8.7 | ◎ |
| Example 7 | 800 | 65 | 25 | 651 | ◎ | 6.7 | ○ |
| Example 8 | 100 | 55 | 5 | 510 | ◎ | 8.1 | ◎ |
| Comparative Example 1 | 10 | 80 | 35 | 654 | ◎ | 1.2 | × |
| Comparative Example 2 | 40 | 30 | 25 | 245 | × | 9.5 | ◎ |
| Comparative Example 3 | 2000 | 50 | 30 | 403 | ◎ | 1.5 | × |

FIG. 7

Table 2

| | first metal particles | | | second metal particles | | melting temperature | | bonding strength | |
|---|---|---|---|---|---|---|---|---|---|
| | first metal | median particle diameter | mixing ratio | second metal | median particle diameter | | | | |
| | | nm | % by mass | | μm | °C | evaluation | MPa | evaluation |
| Example 1 | Cu | 40 | 50 | Sn-50% by mass In | 30 | 405 | ◎ | 8.5 | ◎ |
| Example 9 | CuSn | 200 | 70 | Sn-58% by mass Bi | 25 | 410 | ◎ | 6.7 | ○ |
| Example 10 | CuSn | 20 | 70 | Sn-58% by mass Bi | 25 | 425 | ◎ | 7 | ◎ |
| Example 11 | CuSn | 1000 | 70 | Sn-58% by mass Bi | 25 | 400 | ◎ | 6.2 | ○ |
| Example 12 | CuSn | 200 | 50 | Sn-58% by mass Bi | 25 | 385 | ○ | 6.1 | ○ |
| Example 13 | CuSn | 200 | 36 | Sn-58% by mass Bi | 25 | 340 | ○ | 6 | ○ |
| Example 14 | CuSn | 200 | 70 | Sn-50% by mass In | 25 | 375 | ○ | 7 | ◎ |
| Example 15 | CuSn | 20 | 70 | Sn-50% by mass In | 25 | 390 | ○ | 7.2 | ◎ |
| Example 16 | CuSn | 1000 | 70 | Sn-50% by mass In | 25 | 360 | ○ | 6.5 | ○ |
| Example 17 | CuSn | 200 | 50 | Sn-50% by mass In | 25 | 350 | ○ | 6.4 | ○ |
| Example 18 | CuSn | 200 | 36 | Sn-50% by mass In | 25 | 310 | ○ | 6.2 | ○ |
| Example 19 | CuAg | 20 | 60 | Sn-43% by mass Bi | 5 | 420 | ◎ | 8.9 | ◎ |
| Example 20 | CuAg | 400 | 55 | Sn-9% by mass Zn | 30 | 620 | ◎ | 7.7 | ○ |
| Example 21 | CuNi | 600 | 55 | Sn-66% by mass In | 20 | 610 | ◎ | 7.1 | ◎ |
| Example 22 | CuNi | 120 | 50 | Sn-40% by mass In | 30 | 430 | ◎ | 8.1 | ◎ |
| Example 23 | Cu | 1000 | 36 | Sn-14% by mass Zn | 25 | 530 | ◎ | 6.2 | ○ |
| Example 24 | CuSn | 1000 | 36 | Sn-14% by mass Zn | 25 | 1020 | ◎ | 6 | ○ |
| Example 25 | CuSb | 80 | 50 | Sn-63% by mass Bi | 10 | 480 | ◎ | 7.6 | ○ |
| Comparative Example 4 | Cu | 40 | 80 | Sn-50% by mass In | 30 | 720 | ◎ | 1.4 | × |
| Comparative Example 5 | CuSn | 200 | 90 | Sn-58% by mass Bi | 25 | 590 | ◎ | 1.3 | × |
| Comparative Example 6 | CuSn | 25 μm | 70 | Sn-58% by mass Bi | 25 | 150 | × | 8.8 | ◎ |

BONDED STRUCTURE AND BONDING MATERIAL

BACKGROUND OF THE INVENTION

Field of the Invention

The present disclosure relates to a bonding material that forms a heat-resistant bonding portion that does not contain lead, and a bonded structure formed using the bonding material. More specifically, the present disclosure relates to a bonding material for bonding a semiconductor element formed of a material such as Si, GaN, or SiC to a lead frame, and also relates to a bonded structure of the semiconductor element which is bonded using the bonding material.

Description of the Related Art

Semiconductor electronic components are mounted on a circuit board using a solder material as a bonding material. When a semiconductor element such as an Si chip is bonded to a base plate, "Au-20% by mass Sn" having a melting point of 280° C. is generally used as a bonding material. FIG. 8 is a cross-sectional view schematically showing a state where the semiconductor element 1 is mounted on a base plate 2.

In the present specification, the expression "A-x % by mass B" (wherein A and B are metal elements, x is a percent numerical value) is used to describe a composition of an alloy. This means that the alloy is composed of the metal elements A and B, the percent numerical value of the metal element B is x % by mass, and the balance is a percent numerical value (=100−x) % by mass of the metal element A.

First, using a heating tool type chip bonder device, a first bonding portion 3 is formed by soldering, with a solder material having a melting point of for example 280° C. (for example, "Au-20% by mass Sn"), an external electrode 4 of the semiconductor element to a lead frame 8 including an insulation circuit board 6 and an insulation circuit board electrode 5. Then, in a reflow apparatus of a hot air circulation type, using a solder material having a melting point of 220° C. (for example, "Sn-3% by mass Ag—0.5% by mass Cu"), the insulation circuit board 6 is soldered to a base plate 2 through an electrode 9 so as to form a second bonding portion 7.

When the insulation circuit board 6 to which the semiconductor element 1 has been bonded is soldered to the base plate 2, the insulation circuit board 6 is put into a reflow apparatus heated to a temperature of, for example, 20° C. to 40° C. higher than the melting point of the solder material which forms the second bonding portion 7. In this case, the temperature of the solder material in the first bonding portion 3 may reach a high temperature of 240° C. to 260° C., and there is a possibility that the solder material in the first bonding portion 3 melts. Although the semiconductor element 1 has been bonded while controlled to be located horizontally to the insulation circuit board 6, the semiconductor element 1 may be inclined under such a high temperature condition. In such case, the circuit destruction may occur due to the local heat generation of the semiconductor element 1, or a change in the electrical characteristics of the semiconductor element 1 may occur, causing a defect in a final product.

Therefore, the solder material of the first bonding portion 3 used for bonding the semiconductor element 1 is required to have a resistance to a temperature higher than the maximum temperature reached when soldering is carried out in the reflow apparatus, for example, to have a heat resistance temperature of 260° C. or more.

In recent years, a GaN chip capable of operating at a speed higher than that of an Si chip and an SiC chip capable of performing a high output operation are often used. Since the GaN chip and the SiC chip are more exothermic than the Si chip in operation, a crack defect may be caused wherein the bonded portion is broken when a stress due to the difference in coefficients of thermal expansion between the semiconductor element and the insulating circuit substrate is applied to the bonded portion which portion cannot withstand a distortion derived from the stress. Conventionally, heat is released by attaching an aluminum cooling fin or the like to the base plate 2. When the heat generation amount increases, the first bonding portion 3 having a small heat flux cross section limits the heat dissipation, and therefore, it is becoming difficult to dissipate the heat sufficiently. Also in this sense, it is necessary to improve the heat resistance of the first bonding portion 3.

Therefore, as a first bonding material with improved heat resistance, an Ag nano-paste was proposed in which Ag nanoparticles and a binder are mixed (see Patent Document 1 below). The silver nanoparticles constituting the bonding material are particles having an average particle diameter of 200 nm or less, and by using silver nanoparticles having such an average particle diameter, a bonded structure having a high bonding strength can be formed.

Further, a second bonding material containing a plurality of kinds of Ag powders having different average particle diameters was also proposed (see Patent document 2 below). The bonding material comprises a mixture of three kinds of particles (Ag particles having an average particle diameter of less than 10 nm, Ag particles having an average diameter of 15 nm to 45 nm, and Ag particles having an average particle diameter of 100 nm to 300 nm). By using such mixed particles, a high bonding strength can be obtained even under no pressure or under a self-weight pressure.

Further, a third bonding material containing micro sized Ag particles was proposed (see Patent Document 3 below). The bonding material comprises a mixture of three types of particles (Ag particles having an average particle diameter of 1 nm to 40 nm, Ag particles having an average diameter of 41 nm to 110 nm, and Ag particles having an average particle diameter of 120 nm to 10 μm). By using such mixed particles, it is possible to obtain good bonding without generating voids in a metal bonding layer.

PRIOR ART DOCUMENTS

Patent Documents

Patent Document 1: Japanese Patent No. 5986929
Patent Document 2: Japanese Patent No. 5620122
Patent Document 3: Japanese Patent Laid-Open Publication No. 2018-59192

SUMMARY OF THE INVENTION

With the first bonding material described above, in order to form a bonded structure, it is necessary to heat to a high temperature such as 150° C. to 500° C., and hold the temperature for a long time of 30 minutes to 60 minutes. Further, it is necessary to raise the temperature while pressing an object to be bonded to a substrate, and the pressure is 20 MPa at the maximum, so that the object may be broken.

The second bonding material described above wherein the Ag nanoparticles having the different average particle diameters are mixed can bond without a pressure or under a pressure of a weight of an object to be bonded. The temperature is however to be maintained at a high temperature of 350° C. for 5 minutes. Further, when the bonding temperature is set to 200° C., a time for holding the temperature becomes as long as 30 minutes.

The third bonding material described above wherein the micro sized Ag particles are mixed can form without a pressure a bonding portion in which no void is caused.

However, a high temperature of 250° C. must be maintained for a long time of 60 minutes.

In view of the above mentioned bonding materials, the present disclosure provides a bonding material which is capable of forming a bonding portion having a heat-resistant temperature of 300° C. or higher, for example, 400° C. or higher, by maintaining a relatively lower heating temperature and a relatively shorter holding time, for example, a heating temperature of 200° C. for 10 minutes. Further, the present disclosure provides a method of bonding for example two electronic parts as objects to be bonded to each other using such a bonding material, a bonding portion formed by such a method, and a bonded structure having the bonding portion.

As a result of intensive studies on the above, the present disclosure according in a first aspect provides a bonding material for forming a bonding portion between two objects to be joined. Such bonding material comprises:

(1) first metal particles comprising a first metal which particles have a median metal particle diameter of 20 nm to 1 μm, and (2) second metal particles comprising, as a second metal, at least one alloy of Sn and at least one selected from Bi, In and Zn which particles have a melting point of 200° C. or less, wherein at least one metal element constituting the first metal forms at least one intermetallic compound with Sn derived from the second metal particles, and a melting point of such intermetallic compound is higher than a melting point of the second metal particles, and also lower than a melting point of the first metal particles, and a ratio (mixing ratio) of an amount of the first metal particles to a total amount of the first metal particles and the second metal particles is 36% to 70% on a mass basis (36% by mass to 70% by mass).

In another aspect, the present disclosure provides a method of bonding the objects using such bonding material, and a bonding portion obtained by such method as well as a bonded structure having such bonded portion. It is noted that the bonding portion joins the two objects electrically and mechanically.

Upon using the bonding material of the present disclosure to form the bonding portion, when the bonding material is heated so as to melt the second metal particles, the first metal dissolves and diffuses into a formed liquid phase from the second metal particles, so that at least one intermetallic compound is formed between the first metal and tin. After that, when cooling is performed, a bonding portion is formed. As described below with reference to FIG. 1, the formed intermetallic compound forms a third dimensional network structure (or a matrix structure) 107 (corresponding to a third metal portion described below), and this structure includes a first metal portion 106 derived from the first metal particles (in a case where the first metal particles remain without being involved in forming the intermetallic compound) and/or a second metal portion 108 derived from the second metal particles (in a case where the second metal particles remain without being involved in forming the intermetallic compound). The first metal portion mainly contains the first metal. The second metal portion mainly contains the second metal, and may further contain the first metal. The melting point of the second metal portion is generally about the same as or lower than the melting point of the second metal particles.

The third dimensional network structure formed by the intermetallic compound is able to retain the first metal portion and/or the second metal portion therein. As a result, even when the bonding portion is placed in a high temperature environment at a temperature for example 300° C. at which the second metal particles melt or higher than such temperature (provided that the temperature is lower than the melting point of the intermetallic compound), the intermetallic compound retains the network structure without melting. As a result, even when the second metal portion melts, it remains retained by the network structure, and also the first metal portion remains solid, so that the structure (or form) of the bonding portion as a whole is substantially unaffected by such high temperature.

Further, by changing configuration of the first metal particles and the second metal particles of the bonding material which can form the network structure of the intermetallic compound, it becomes possible to control heat resistance temperature and bonding strength of the bonding portion. Specifically, by appropriately selecting the kinds of the metals that form the first metal particles and the second metal particles, and median particle diameters of the first metal particles and the second metal particles, a mixing ratio of these metal particles, and the like, a desired melting point of the intermetallic compound (corresponding to the heat resistance of the bonding portion) and a desired bonding strength can be achieved.

As a result, for example, even when the bonding material of the present disclosure is used for bonding a semiconductor element generating a large calorific value such as a GaN semiconductor element or an Si semiconductor element, cracks are unlikely to occur in the bonding portion, so that the reliability reduction of the bonded structure is suppressed. Furthermore, upon using the bonding material of the present disclosure for bonding, when soldering is carried out in a heating device, soldering at a relatively low temperature in a shorter time is possible since the second metal particles are melted at a temperature of 200° C. or less, and thereby reducing energy consumption in an assembling step for bonding the semiconductor elements.

BRIEF DESCRIPTION OF THE DRAWINGS

FIG. 6 shows Table 1 showing the melting temperatures and the bonding strengths of the bonding portions formed while using the bonding materials with various first metal particles and various second metal particles.

FIG. 7 shows Table 2 showing the melting temperatures and the bonding strengths of bonding portions formed while using bonding materials with various first metal particles and various second metal particles.

DETAILED DESCRIPTION OF THE INVENTION

The embodiments of the present disclosure will now be described in more detail with reference to the accompanying drawings. The following embodiments are illustrative for carrying out the present disclosure, and the present disclosure is not limited to those embodiments.

<Bonded Structure>

Figure 1:
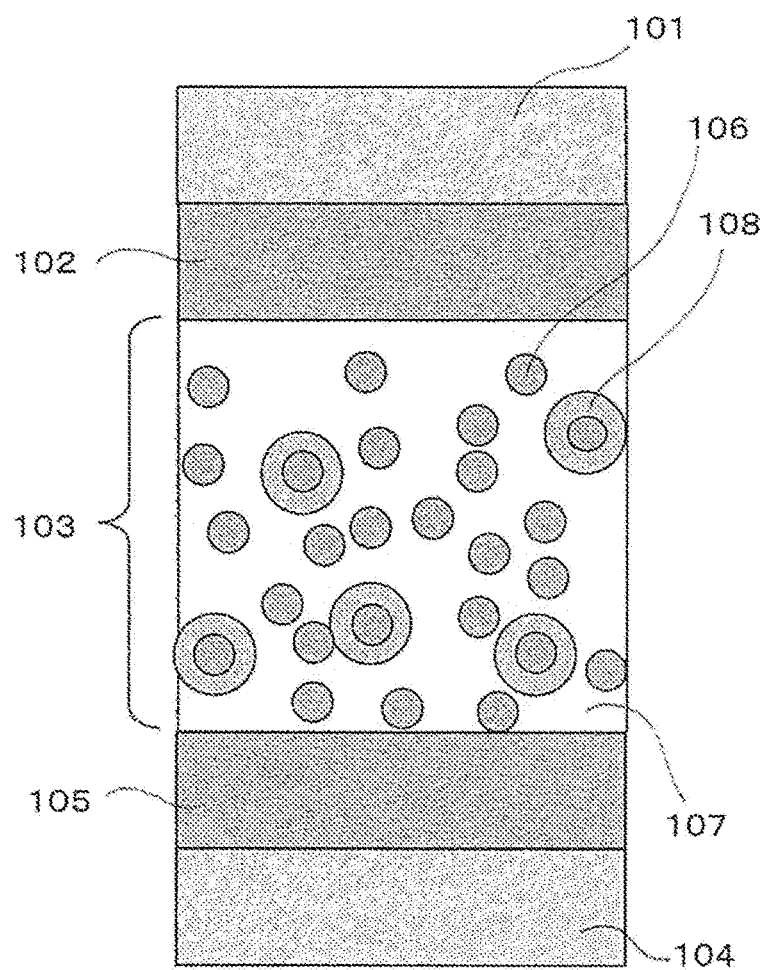
FIG. 1 schematically shows a cross section of a bonded structure of the present disclosure having a bonding portion of the present disclosure formed using the bonding material of the present disclosure.

FIG. 1 schematically shows a bonded structure having a bonding portion formed by using a bonding material of the present disclosure. FIG. 1 shows, as one example, an embodiment in which an external electrode 102 of a semiconductor element 101 as one object is bonded to an electrode 105 of an insulation circuit board 104 as the other object by the bonding portion 103. The bonding portion 103 shown in FIG. 1 is formed by using a bonding material which contains the first metal particles including for example Cu as the first metal and the second metal particles including for example an Sn—In based alloy as a second metal.

The bonding portion 103 contains a third metal portion 107 which is derived from CuSn as an intermetaliic compound and which contains the intermetallic compound as a main component, in addition to the first metal portion 106 containing Cu as a main component derived from a first metal particles and the second metal portion 108 containing Sn—In as a main component derived from the second metal particles. As shown, the first metal portion 106 is surrounded by the second metal portion 108 or the third metal portion 107. The second metal portion usually contains also the first metal derived from the first metal particles. It is noted that the first metal portion corresponds to the first metal particles, and is smaller than the first metal particle because the first metal has dissolved into the formed liquid phase.

The third metal portion 107 has the three dimensional network structure, includes the first metal portions 106 and the second metal portions 108 therein as shown in FIG. 1, and bonds an external electrode 102 and an insulation circuit board electrode 105. Such third metal portion has a melting point corresponding to the melting point of the formed intermetallic compound, for example a melting point of 400° C. or more. As a result, even when the bonding portion is heated to a high temperature close to 300° C. or more, for example, 400° C., the network structure is maintained without melting. Therefore, the bonding portion 103 is not broken and has excellent heat resistance.

The object to be bonded by the bonding material of the present disclosure may be any appropriate electronic component, an electrical component, or the like which is to be physically and electrically bonded, that is, of which electrical continuity is ensured and which is mechanically bonded. Specific examples thereof include electrodes of semiconductor elements, circuit boards, lead frames, insulation circuit boards and the like, electrodes of various electric and electronic parts, and the like. A semiconductor element will be described as an example of such an object to be bonded.

<Semiconductor Element>

For the semiconductor element, a piece having a size of 2 mm×1.6 mm may be used which is a cutout from a wafer having a diameter of, for example, 6 inches and a thickness of, for example, 0.3 mm, and made of any suitable material. The semiconductor element may be formed of GaN, Si, SiC or the like, and also may be made of GaAs, InP, ZnS, ZnSe, SiGe or the like. The semiconductor element may have any suitable size, and depending on its function, 6 mm×5 mm or 4.5 mm×3.55 mm may be used as a larger size, or 3 mm×2.5 mm may be used as a smaller size. The semiconductor element may have any suitable thickness, and may have a thickness of 0.4 mm, 0.3 mm, 0.2 mm, 0.15 mm or the like depending on the size of the semiconductor element.

<Insulating Circuit Board>

The insulation circuit board is generally made of a ceramic which has a surface treatment layer plated electrolytically with for example Au having a thickness of 0.3 mm on a bonding material side of the insulation circuit board so as to secure bonding with the bonding material. For the surface treatment layer, Ag, Ni, Pt, Pd, Sn or the like may be used which has a good bonding property with the bonding material. The thickness of the surface treatment layer may be 0.1 μm or more in consideration of the thickness variation of the layer. The deposition method of the layer is not limited to the electrolytic plating method, and the vapor deposition method, the electroless plating method, or the like may be used.

Accordingly, the bonded structure of the present disclosure includes the bonding portion between the semiconductor element and the insulation circuit board as the objects, and such bonding portion is formed by arranging the bonding material of the present disclosure between these objects, and includes the third metal portion 107 in addition to the first metal portion 106 and the second metal portion 108.

<Bonding Material>

Figure 2:
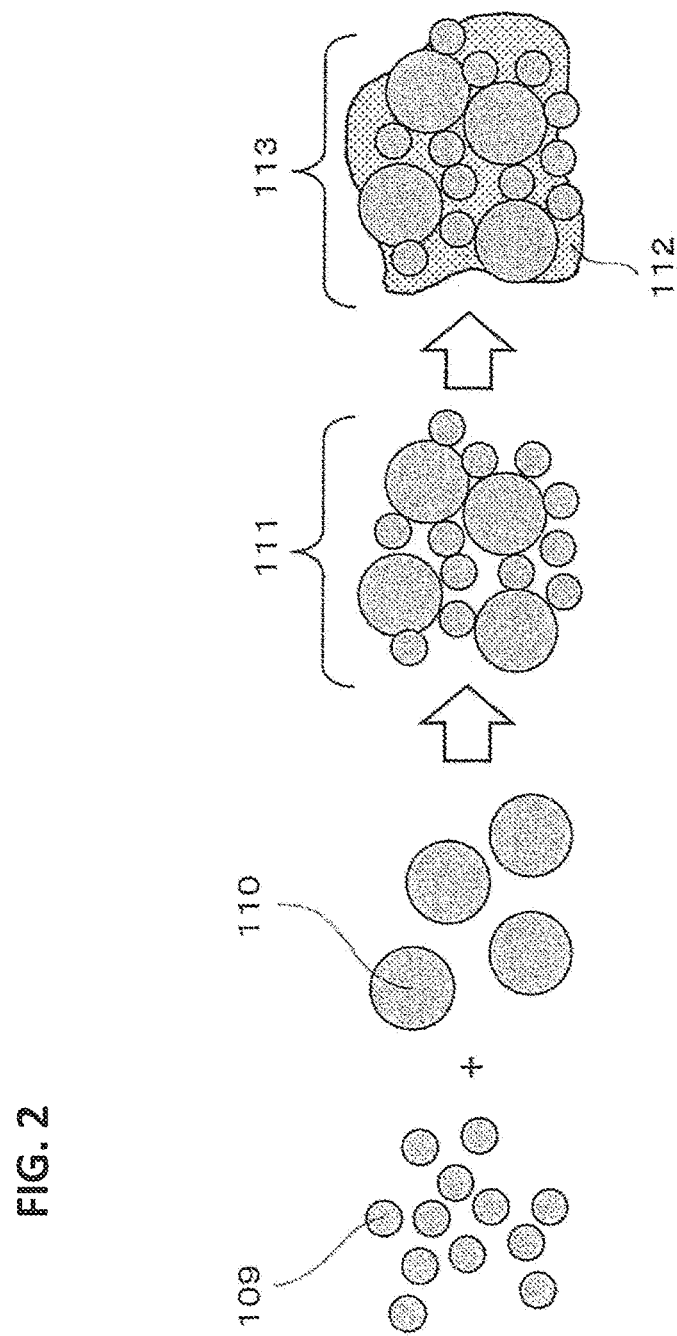
FIG. 2 schematically shows a process of producing the bonding material of the present disclosure.

FIG. 2 schematically shows an example of a process for producing the bonding material of the present disclosure. First, the first metal particles 109 and the second metal particles 110 are mixed at a predetermined ratio (i.e., a mixing ratio) to prepare a particle mixture 111. Next, a binder 112 (generally used one, for example, diethylene glycol monohexyl ether, 2-ethyl 1, 3-hexane diol or the like as a solvent, and 1, 3-diphenyl guanidinium hydrobromide, stearic acid or the like as a reducing agent) is added to the particle mixture, and these are stirred and mixed to obtain a bonding material 113 of the present disclosure. The bonding material may further contain other components when necessary, in addition to the first metal particles and the second metal particles and the binder. For example, such other component may be castor oil, Gel All MD, or the like may also be contained in order to impart thixotropy, and/or may be rosins, polybutene or the like in order to adjust viscosity.

The first metal contained in the first metal particles 109 is, for example, Cu (having a melting point of 1085° C.), and the median particle diameter of the first metal particles is, for example, 40 nm. The second metal contained in the second metal particles 110 is, for example, "Sn-50% by mass In" (having a melting point of 120° C.), and the median particle diameter of the second metal particles is, for example, 30 µm. These metal particles, in addition to the metals contained therein, may contain other components as needed and may also include other components which are inevitably included in the preparation of the particles. In any case where such other component is contained, it may be included as long as it does not cause unacceptable adverse effects on the object of the present disclosure. In one embodiment of the bonding material of the present disclosure, the first metal particles are usually made of the first metal, and the second metal particles are usually made of the second metal.

The mass ratio of the first metal particles 109 to the total mass of the first metal particles 109 and the second metal particles 110 (that is, the mass of the particle mixture 111), namely, the mixing ratio is, for example, 50% by mass. An amount of the binder contained in the bonding material is such that handling of the bonding material, for example, supply of the bonding material to the electrode by a dispenser is not hindered. The amount of binder may be usually from 9% to 30%, for example 20%, by mass based on the total amount of the binder and the particle mixture.

<Bonding Method>

Figure 3:
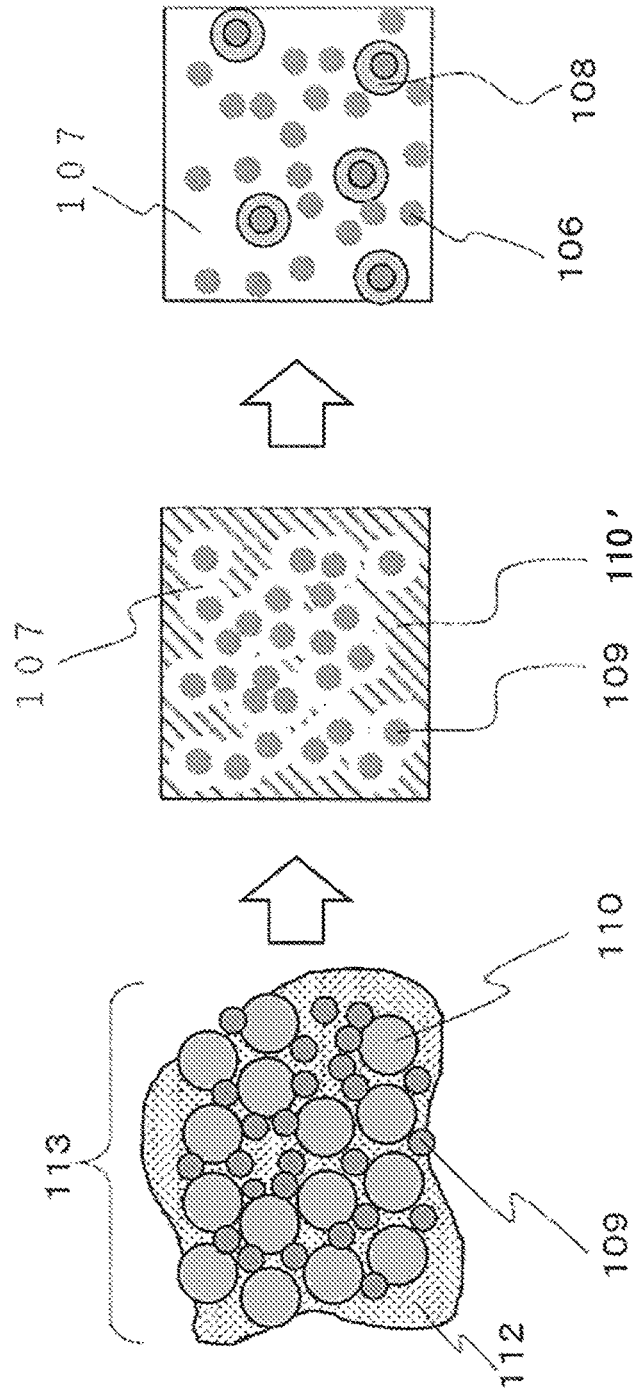
FIGS. 3A to 3C conceptually show a process of forming a bonding portion with using the bonding material of the present disclosure, wherein FIG. 3A schematically shows a state of the bonding material before soldering with heating, FIG. 3B schematically shows a state where an intermetallic compound is being formed in a liquid phase formed by molten second metal particles, and FIG. 3C schematically shows a bonding portion after soldering.

FIG. 3 schematically shows a process of forming the bonded structure 103 of the present disclosure by forming the bonding portion of the present disclosure between the objects using the bonding material of the present disclosure. The bonding material 113 prepared as described above is supplied onto an insulation circuit substrate electrode (not shown) by a dispenser, and a semiconductor element (not shown) is mounted on the bonding material 113. Thereafter, these are heated to a predetermined temperature to form the bonding portion.

FIG. 3A schematically shows a state of the bonding material 113 after the semiconductor element has been mounted on the bonding material and before the semiconductor element has not been soldered by heated.

There is a mixture of the particles (the first metal particles 109 plus the second metal particles 110) in the binder 112. The semiconductor element mounted as described above is soldered by heating to a temperature higher (for example, to a temperature 20° C. higher) than the melting point of the second metal particles, for example, to a temperature of 200° C. in a nitrogen atmosphere having an oxygen concentration of for example 200 ppm.

As shown in FIG. 3B, the binder 112 evaporates and the second metal particles melt to form a substantially integrated liquid phase during the heating as described above, so that the first metal particles 109 which are not melted disperse in the liquid phase. In the state as shown in FIG. 3B where a portion 110' derived from the molten second metal particles surrounds the first metal particles 109, the first metal dissolves from the first metal particles 109, and reacts with Sn of the portion 110' derived from the molten second metal particles to form an intermetallic compound. As a result, the third metal portion 107 containing the intermetallic compound is formed around the first metal particles 109 as shown in FIG. 3B.

As the time of keeping such heating elapses, an amount of the formed intermetallic compound increases, and the regions of the third metal portions 107 expand as shown in FIG. 3C. For example, when the heating is kept for 10 minutes, the network structure is formed. When cooled to room temperature thereafter, a bonding portion formed. In this bonding portion, there are, in the network structure 107 of the third metal portion, the first metal portion 106 which is derived from the first metal particles and of which main component is the first metal and the second metal portion 108 which is derived from the second metal particles 107 and of which main component is the metal of the second metal. Specifically, the second metal portion 108 contains mainly the metal of the second metal which remains without being involved in the formation of the intermetallic compound, and in addition to this, also contains the first metal which has dissolved from the first metal particles but has not been involved in the formation of the intermetallic compound. The melting point of the second metal portion 108 is equal to or lower than the melting point of the second metal particle.

The bonding material 113 which is capable of forming the bonding portion as described above is prepared by mixing the second metal particles 110 having a melting point of 200° C. or less (for example, second metal particles composed of "Sn-50 W by mass In" as the second metal having a melting point of 120° C.) and the first metal particles having a melting point higher than that of the intermetallic compound to be formed (for example, first metal particles made of Cu as the first metal having a melting point melting point 1085° C.). Therefore, when the second metal particles 110 melt by heating the bonding material to only, for example, 200° C., the second metal particles 110 melt. Thus, Cu dissolves and diffuses into the molten "Sn-50% by mass In" in a short time, and forms the intermetallic compound with Sn in the liquid phase. Therefore, the bonding portion, and thus the bonded structure can be formed in a short time.

Accordingly, the method of forming a bonding portion or a bonding method of the present disclosure comprises a step of supplying the bonding material to one of two objects to be bonded, a step of placing the other object on the supplied bonding material so that the bonding material is located between the two objects, a step of heating the bonding material and the objects to a temperature higher than the melting point of the second metal particles, preferably to a temperature 20° C. higher than the melting point of the second metal particles (for example to a temperature of 200° C.), and a step of keeping such heating for a predetermined time (for example, a term of one minute to 30 minutes, preferably ten minutes or more) followed by cooling.

<First Metal Particles>

In the bonding material of the present disclosure, the first metal particles 109 have a granular form comprising the first metal, and are usually composed of the first metal. The granular form is a so-called "grain" shape including a spherical shape, a substantially spherical shape, an elliptic spherical shape, a polyhedron and a core shell, and a combination of at least two of these shapes.

The first metal constituting the first metal particles is a metal or an alloy element which dissolves and diffuses in the liquid phase formed by melting of the second metal particles, and forms the intermetallic compound with Sn which forms the second metal. Specific examples of the first metal include a simple metal such as Ag, Ni, Cu, Fe, and Sb, and an alloy of Cu and at least one other metal, for example, a Cu—Sb alloy, an Ag—Cu alloy, a Cu—Ni alloy, a Cu—Sb alloy, and the like. At least one of those metal elements forms the intermetallic compound with Sn. Among them, Cu or an alloy with Cu is particularly preferred as the first metal.

At least one of the metal elements constituting the first metal (for example, Cu only, or Cu and Ag) dissolves and diffuses in the liquid phase formed by melting of the second metal particles to react with Sn which is present in the liquid phase and derived from the second metal of the second metal particles to form at least one intermetallic compound. For example, Cu as the first metal reacts with Sn in the liquid phase of the molten second metal particles to form Sn—Cu based intermetallic compounds (for example, $Cu_6Sn_5$, $Cu_3Sn$ and the like). It is known that Sn forms various intermetallic compounds with various metals. For example, Sn—Ni based intermetallic compounds, Sn—Ag based intermetallic compounds, Sn—Ag—Cu based intermetallic compounds, Sn—Cu—Ni based intermetallic compounds, and the like are known as such intermetallic compounds.

In the present disclosure, the first metal particles and the second metal particles are generally substantially made of the first metal and the second metal, respectively, and the melting points of those particles means the melting points of the first metal and the second metal particles, respectively. When these particles are composed of a plurality of components, so that they have a plurality of melting points, the melting point of the first metal, and hence the melting point of the first metal particles, means the lowest melting point, whereas the melting point of the second metal, and hence the melting point of the second metal particles, means the highest melting point. These melting points are inherent to the metal that constitutes the metal particles, and are known in principle, and can also be measured using a differential scanning calorimeter (DSC).

The melting point of the first metal particles is higher than the aimed heat resistant temperature. It is preferably at least 200° C., and more preferably at least 300° C. higher than the heat resistant temperature. In the bonding material of the present disclosure, the intermetallic compound to be formed has a melting point between the melting point of the first metal particles and the melting point of the second metal particles. Since the intermetallic compound melts at its melting point, the melting point of the intermetallic compound substantially corresponds to the heat resistant temperature of the bonding portion. Therefore, in order to increase the heat resistant temperature, it is preferable to increase the melting point of the intermetallic compound to be formed. In general, by increasing the melting point of the first metal, the melting point of the intermetallic compound is increased.

<Particle Diameter of First Metal Particles>

As regards the size of the first metal particles, the concept of "median particle diameter" is used. This median particle diameter means a 50% diameter of the integrated value of the volume-based particle size distribution (i.e. so-called Dv50) obtained by the particle diameter measurement using the dynamic light scattering method. The median particle diameter is calculated by measuring the fluctuation of scattered light when irradiated with laser light.

The median diameter of the first metal particles referred to herein was measured using a dynamic light scattering particle size distribution measuring device (manufactured by Malvern Panalytical, product name: Zetasizer Nano ZS) which is commonly used for the measurement of the particle size distribution in submicron size while using pure water as a dispersion medium.

Figure 4:
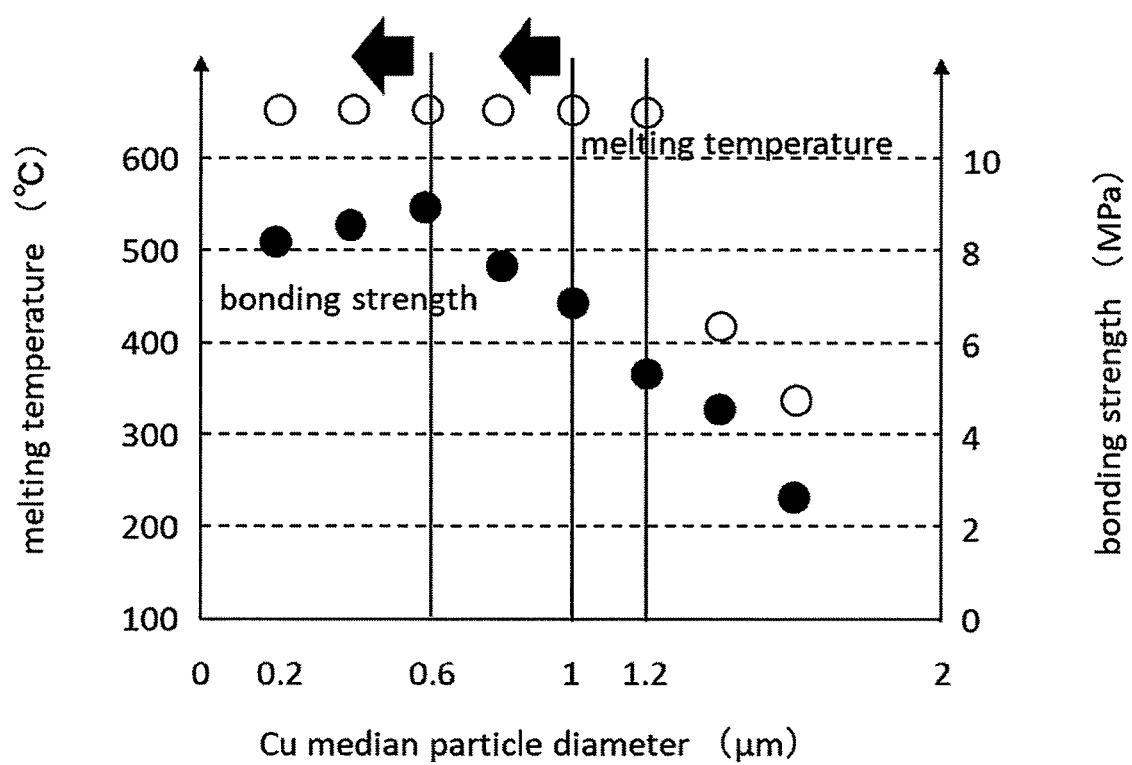
FIG. 4 shows a graph showing a relationship between the median particle diameter of Cu particles as the first metal particles contained in the bonding material and the melting temperature and bonding strength of the formed bonding portion.

FIG. 4 is a graph showing the results of measuring the melting temperature and the bonding strength of the bonding portion formed using a paste-like bonding materials which were prepared by varying the median particle diameter of the first metal particles 109 included in the bonding material.

As the second metal particles, those formed of the second metal of "Sn-50% by mass In" and having a median particle diameter of 30 μm were used. The mass ratio of the first metal particles to the total mass of the second metal particles and the first metal particles, that is, the mixing ratio was 50% by mass. A mixture of the first metal particles and the second metal particles was mixed with a binder (diethylene glycol monohexyl ether and 1, 3-diphenyl guanidine hydrobromide) to obtain a paste of the bonding material. Thereafter, the paste was transferred to a Cu plate (20 mm×10 mm) with a thickness of 100 μm, and an Si chip (1 mm×1 mm) was placed on the paste, followed by heating at 200° C. for 10 minutes, and then cooling to room temperature to obtain a bonded structure in which a bonding portion was formed.

In FIG. 4, the horizontal axis represents the median diameter of the Cu particles, and the vertical axis represents the melting temperature (◯ in FIG. 4) of the bonding portion measured by a differential scanning calorimeter (DSC) and the bonding strength (● in FIG. 4) of the Si chip having 1 mm×1 mm measured by a bond tester. It is noted that the melting temperature of the bonding portion was measured by using a differential scanning calorimeter for a test piece cut out from the formed bonding portion. Specifically, the melting temperature of the bonding portion is defined as a temperature at the bottom of the first absorption peak among absorption peaks which are present at a higher temperature side as to the melting point of the second metal when increasing the temperature of the DSC.

As can be understood from FIG. 4, when the median particle diameter of the Cu particles as the first metal particles exceeds 1 μm, the bonding strength is reduced to 6 MPa or less. It is conceivable that the specific surface area of the Cu particles becomes small when the median particle size is increased, and as a result of that, an amount of the dissolving and diffusing into the liquid phase derived from the second metal particles is reduced, and thereby suppressing the formation of the intermetallic compound.

When considering that it is particularly desirable that the bonding strength is 8 MPa or more in a particularly preferred embodiment, the median particle diameter of the Cu particles is more preferably 600 nm or less. Further, when the median particle diameter of the Cu particles is larger than 1.2 μm, the melting temperature rapidly decreases. It is conceivable that the formation of the intermetallic compound does not proceed sufficiently, so that a residual amount of Sn—In as the second metal is increased in the second metal portion existing in the bonding portion is increased.

Considering the above, in a preferred embodiment, when the median particle diameter of the Cu particles as the first metal particles is 1 μm or less, the bonding strength is 6 MPa or more. In a more preferred embodiment, the bonding strength is 8 MPa or more when the median particle diameter of the first metal particles is 600 nm or less. For first metal particles such as the Cu particles, when the median particle diameter is less than 20 nm, it is not easy to uniformly mix the particles with the second metal particles, and in consideration of this, it is preferable that the median particle diameter of the first metal particles is 20 nm or more. Therefore, in a preferred embodiment of the present disclosure, the median particle diameter of the first metal particles constituting the bonding material is 20 nm to 1 μm, and in a more preferred embodiment, 20 nm to 600 nm. When the first metal particles have a median particle diameter in these ranges, a bonded structure can be obtained having a bonding portion which has a sufficient bonding strength and a melting temperature of 400° C. or more.

From the viewpoint of manufacturing techniques, it is also possible to produce the first metal particles having a smaller median particle diameter (for example, 5 nm). Therefore, when the uniform mixing with the second metal particles is ensured, the lower limit value of the above-mentioned ranges of the median particle diameter of the first metal particles of the present disclosure may be, for example, 5 nm or less.

<Second Metal Particles>

In the bonding material of the present disclosure, the second metal particles have a granular form comprising the second metal and are usually made of the second metal. As in the case of the first metal particles, the granular form may be in the form of a so-called "granular" shape including a spherical shape, a substantially spherical shape, an elliptical spherical shape, a polyhedral shape, a shape of a combination of at least two of these, and the like, and may be in an amorphous state. As to the median particle diameter of the second metal particles, the median particle diameter of the first metal particles described above (Dv50) is similarly applicable.

The second metal particles constituting the bonding material of the present disclosure have a melting point of 200° C. or less, and are made of the second metal. The second metal particles melt at a temperature of 200° C. or less to form the liquid phase into which the first metal of the first metal particles dissolves when the bonding material is heated so as to form the bonding portion. In other words, the second metal particles have a melting point equal to 200° C. or less in order that the bonding material of the present disclosure forms the bonding portion by means of heating to a relatively low temperature of up to 200° C.

The second metal is an alloy of Sn and other metal. The other metal is at least one selected from Bi, In and Zn. Specific examples of the second metal include an Sn—In alloy, an Sn—Bi alloy, an Sn—Zn alloy and the like. The alloy may be a two component system (i.e. binary system) alloy or a multi-component system alloy composed of more components, and may be, for example, an Sn—Bi—In alloy. More specifically, an "Sn-50 W by mass In" alloy (melting point: 120° C.), an "Sn-58% by mass Bi" alloy (melting point: 138° C.), an "Sn-43% by mass Bi" alloy (melting point: 162° C.), an "Sn-9 W by mass Zn" alloy (melting point: 199° C.) and the like are exemplified as the second metals. It is noted that the second metal may be an alloy of one kind or an alloy of a plurality of kinds alloy.

<Particle Diameter of Second Metal Particles>

The median particle size referred to herein regarding the second metal particles was measured by a laser diffraction particle size distribution measuring device (manufactured by MicrotracBEL, product number: Microtrac MT3300EX2) commonly used for measuring the distribution of micron-sized particle diameters with using using pure water as a dispersion medium. In the present disclosure, any of the particles may also have a multimodal distribution (for example, bimodal distribution), but it is particularly preferred that they have a monomodal distribution. The particle size distribution of the metal particles used in the present disclosure may be of a polydisperse system, but it is preferably of a monodisperse system or a system which is close to the monodisperse system.

In the production of the second metal particles, small particles having a median particle diameter of up to 5 μm can be produced by using for example a centrifugal atomization method. In general, when particles having a diameter less than 5 μm are produced, a yield thereof becomes extremely low, so that the cost of the particles is increased. From this viewpoint, the lower limit of the median particle diameter of the second metal particles is, for example, 5 μm. On the contrary, when the particle size becomes larger, nozzle clogging of a dispenser which supplies the bonding material is liable to occur. In consideration of this, the upper limit of the median particle diameter of the second metal particles is, for example, 35 μm. Therefore, a preferred range of the median particle diameter of the second metal particles is, for example, 5 μm to 35 μm. The upper limit and/or lower limit of the median particle diameter may vary depending on the improvements of the manufacturing technique of the second metal particles and the dispenser and the like, and in such a case, the range is extended.

<Mixing Ratio of First Metal Particles and Second Metal Particles>

The bonding material of the present disclosure comprises the first metal particle and the second metal particle, and usually further comprises the binder. Since the binder is evaporated by heating as described above upon forming the bonding portion, the mixing ratio of the first metal particles and the second metal particles is important to the performance of the formed bonding portion. It is noted that as the binder, any material generally used for preparing a solder paste may be used, and examples thereof include diethylene glycol mono-2-ethylhexyl ether, propylene glycol monophenyl ether and the like.

Figure 5:
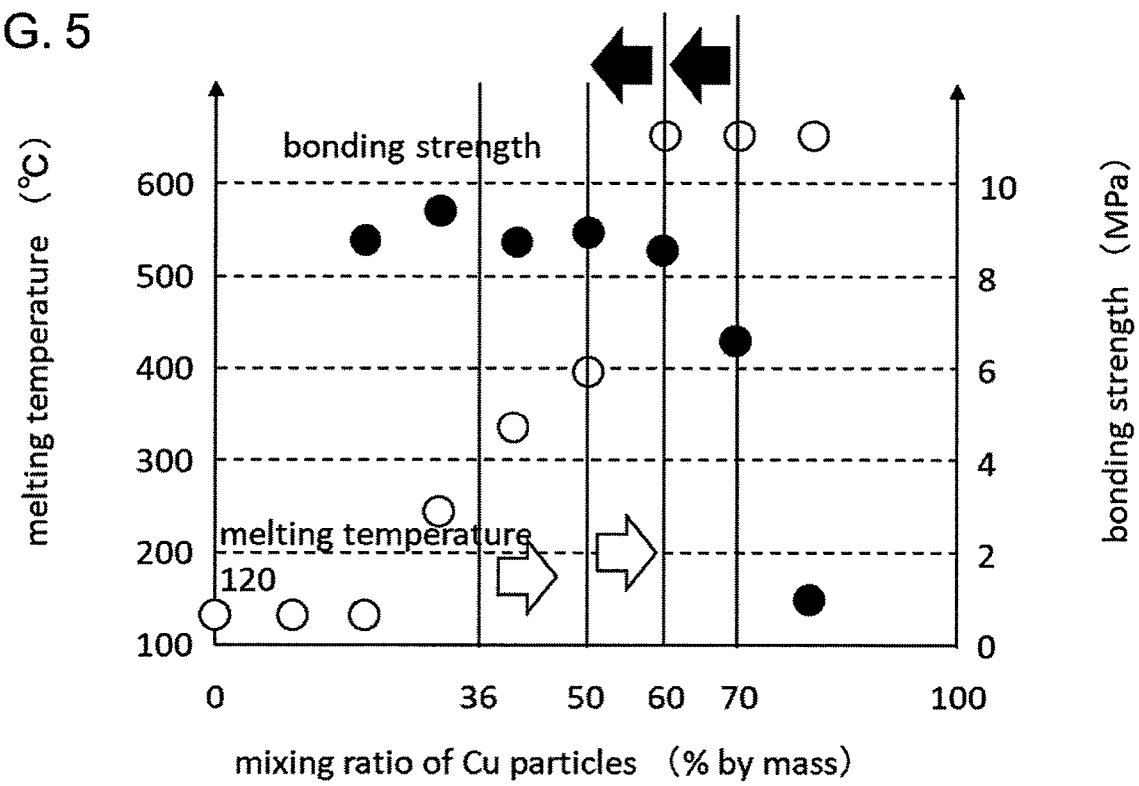
FIG. 5 shows a graph showing a relationship between a mixing ratio of the first metal particles contained in the bonding material and the melting temperature and the bonding strength of the formed bonding portion.
Figure 8:
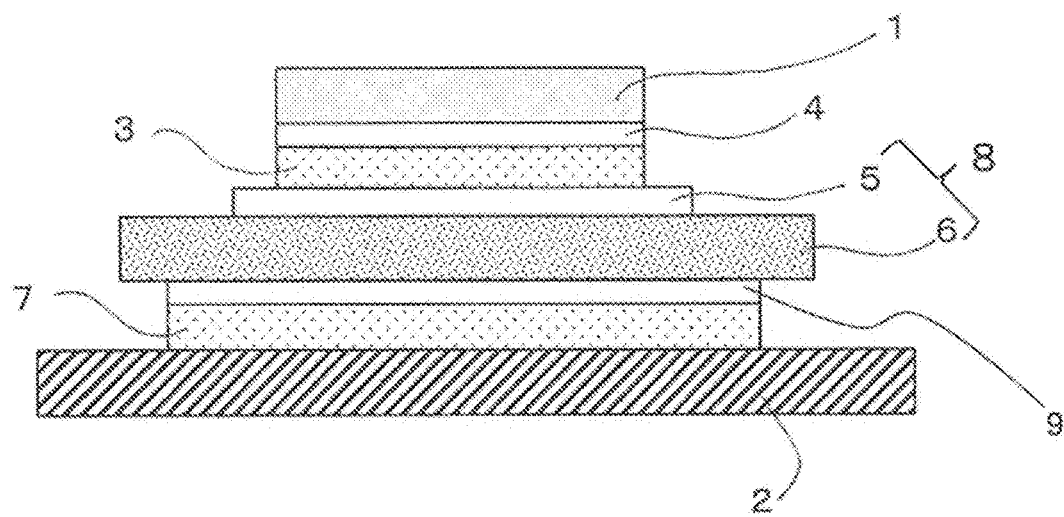
FIG. 8 schematically shows a cross section of a state where a semiconductor element is bonded to a base plate.

FIG. 5 shows results of measurement of the melting temperature and the bonding strength of the bonding portion formed with various paste-like bonding materials while the ratio by mass of an amount of the first metal particles to the total amount of the second metal particles and the first metal particles, i.e., the mixing ratio of the first metal particles, was varied.

As the first metal particles, Cu particles having a median particle diameter of 40 nm were used, and as the second metal particles, particles made of a second metal ("Sn-50% by mass In") having a median particle diameter of 30 μm were used. A mixture of the first metal particles and the second metal particles was mixed with a binder (diethylene glycol monohexyl ether and 1, 3-diphenyl guanidine hydrobromide) to obtain a paste of a bonding material. Thereafter, the paste was transferred to a Cu plate (20 mm×10 mm) with a thickness of 100 μm, an Si chip (1 mm×1 mm) was placed thereon, followed by heating at 200° C. for 10 minutes and then cooling to room temperature to obtain a bonded structure in which a bonding portion was formed.

In FIG. 5, the horizontal axis represents the mixing ratio of the Cu particles as the first metal particles, and the vertical axis represents the melting temperature (white circle ○ in FIG. 5) measured by the differential scanning calorimeter (DSC) and the bonding strength (black circle ● in FIG. 5) to the Si chip (1 mm×1 mm) measured by the bond tester. It is noted that the melting temperature and the bonding strength of the bonding portion were measured as in the same manners as described above.

The melting point of Cu is 1085° C. while the melting point of "Sn-50% by mass In" is 120° C. As apparent from the graph of FIG. 5, the mixing ratio of the Cu particles necessary for providing a melting temperature of, for example, 300° C. or more is 36% by mass or more. The melting temperature is more preferably 400° C. or more, and in this case, the mixing ratio of Cu particles as the first metal particles is 50% by mass or more.

When the mixing ratio of the Cu particles is more than 70% by mass, an amount of Sn derived from the second metal is insufficient to form the intermetallic compound portion. As a result, it is conceivable that gaps are formed between the first metal portion 106 (in which a large amount of the Cu particles remains due to its large amount) and the third metal portion 107 which is the intermetallic compound portion, so that the bonding strength is reduced. Since a bonding strength of 8 MPa or more is particularly desirable, it is preferable that the mixing ratio of the Cu particles as the first metal particles is 60% by mass or less.

As can be seen from the graph in FIG. 5, when the mixing ratio of the Cu particles is 50% to 60% by mass, the melting temperature is 400° C. or more, so that the effect of withstanding the heat generated in the semiconductor element can be sufficiently obtained. When the mixing ratio of the Cu particles exceeds 60% by mass, the bonding strength is reduced to 8 MPa or less, but it is still 6 MPa or more and the melting temperature is 600° C. or more with the mixing ratio up to 70% by mass. Thus, such mixing ratio (70% by mass or less) can be used for bonding of the semiconductor element.

Examples and Comparative Examples

In the bonding portion of the bonded structure, both of the melting temperature and the bonding strength are required to be compatible with each other. In order to study this compatibility, the median particle diameters of the first metal particles (Cu particles) the second metal particles ("Sn-50% by mass In" particles) as well as the mixing ratio of these particle were varied to prepare various bonding materials. Using the bonding materials, the bonding portions were formed in the same manner as in the above and then experiments were carried out for measuring the melting temperature and the bonding strength as described above. The results are shown in Table 1 of FIG. 6.

In column of the melting temperature shown in Table 1, evaluations of the bonding portion are also shown while a standard heat resistance temperature of the bonding portion is assumed to be 300° C. In that column, a white circle (○) means a good evaluation, a double circle (◎) means a sufficiently good evaluation, and a cross (X) means an insufficient evaluation of not satisfying the standard heat resistance temperature. In the column of the bonding strength column in Table 1, evaluations of the bonding strength are also shown while a standard bonding strength of the bonding portion assumed to be 6 MPa. In that column, a white circle (○) means a good evaluation, a double circle (◎) means a sufficiently good evaluation, and a cross (X) means an insufficient evaluation of not satisfying the standard bonding strength. The experiments which provided the "○" or "◎" evaluation with regard to the both of the melting temperature and the bonding strength are referred to as "Examples", and the experiments which provided the "X" evaluation with regard to any one of the melting temperature and the bonding strength are referred to as "Comparative Examples".

Example 1

The paste 113 of the bonding material prepared using the first metal particles and the second metal particles in Table 1 was transferred onto a Cu plate (20 mm×10 mm) with a thickness of 100 µm. An Si semiconductor element (1 mm×1 mm) was placed thereon, and heated at 200° C. for 10 minutes to form a bonded structure. When the bonded structure was measured with a differential scanning calorimeter, an endothermic peak was located at 405° C. This means that the bonding portion had a heat resistance of 400° C. or more. Further, the bonding strength of the Si semiconductor element was measured by a bond tester, and measured bonding strength was 8.5 MPa, which means a sufficient bonding strength.

Examples 2 to 8 and Comparative Examples 1 to 3

In the same manner as in Example 1, using the bonding material prepared using the first metal particles and the second metal particles in Table 1, a bonded structure was obtained, and its melting temperature and bonding strength were measured.

As can be seen from Table 1, when the size (median particle diameter) of the Cu particles which are the first metal particles is in the range of 20 nm to 1000 nm, the bonding strength exceeds 6 MPa, so that sufficient bonding strength can be obtained. When the mixing ratio of the Cu particles is 30 W by mass, the melting temperature is reduced to less than 300° C., so that the heat resistance is not always sufficient. From these results, it is preferable that the median particle diameter of the Cu particles necessary for obtaining sufficient bonding strength is 20 nm to 1 µm, and that the mixing ratio of the Cu particles is in the range of 36 to 70% by mass to obtain a melting temperature of 300° C. or more.

Examples 9 to 25 and Comparative Examples 4 to 6

Similarly to the above described Examples and Comparative Examples, bonding materials were prepared by variously changing the kind of the first metal and the median particle diameter of the first metal particles, the kind of the second metal and the median particle diameter of the second metal particles, and the mixing ratio of the first metal particles, and bonding portions were formed in the same manner as described above, and the melting temperatures and the bonding strengths of the bonding portions were measured. The results are shown in Table 2 of FIG. 7. In the Table 2, the distinction between the Examples and Comparative Examples as well as the evaluations are the same as those described above. Table 2 also includes the results of Example 1.

In Example 9, a particle mixture was obtained from the first metal particles made of CuSn as the first metal having a median particle diameter of 200 nm and the second metal particles made of an "Sn-58% by mass Bi" as a second metal having a median particle diameter of 25 µm. The mixture was mixed with a binder to prepare a paste-like bonding material. A bonded structure was formed in the same manner as in the above experiments, and the melting temperature and the bonding strength of the structure were measured.

The melting temperature of the bonding portion of the bonded structure is 410° C., and it is understood that the heat resistance is 400° C. or more. The bonding strength measured by the bond tester was 6.7 MPa, which means that it is a sufficient strength.

In Example 10, a particle mixture was obtained from the first metal particles made of CuSn as the first metal having an median particle diameter of 20 nm, and the second metal particles made of an "Sn-58% by mass Bi" as a second metal having a median particle diameter of 25 µm (mass of the first metal particles: mass of the second metal particles=70:30). The mixture was mixed with a binder to prepare a paste-like bonding material. A bonded structure was formed in the same manner as in the above experiments, and the melting temperature and the bonding strength of the structure were measured.

The melting temperature of the bonding portion of the bonded structure is 425° C., and it is understood that the heat resistance is 400° C. or more. The bonding strength measured by a bond tester was 7.0 MPa, which means that it is a sufficient strength.

In Example 11, a particle mixture was obtained from the first metal particles made of CuSn as the first metal having an median particle diameter of 1000 nm and the second metal particles made of an "Sn-58% by mass Bi" as a second metal having a median particle diameter of 25 μm (mass of the first metal particles: mass of the second metal particles=70:30). The mixture was mixed with a binder to prepare a paste-like bonding material. A bonded structure was formed in the same manner as in the above experiments, and the melting temperature and the bonding strength of the structure were measured.

The melting temperature of the bonding portion of the bonded structure is 400° C., and it is understood that the heat resistance is 400° C. or more. The bonding strength measured by a bond tester was 6.2 MPa, which means that it is a sufficient strength.

In Example 12, a particle mixture was obtained from the first metal particles made of CuSn as the first metal having an median particle diameter of 200 nm and the second metal particles made of an "Sn-58% by mass Bi" as a second metal having a median particle diameter of 25 μm (mass of the first metal particles: mass of the second metal particles=50:50). The mixture was mixed with a binder to prepare a paste-like bonding material. A bonded structure was formed in the same manner as in the above experiments, and the melting temperature and the bonding strength of the structure were measured.

The melting temperature of the bonding portion of the bonded structure is 385° C., and it is understood that the heat resistance is 300° C. or more. The bonding strength measured by a bond tester was 6.1 MPa, which means that it is a sufficient strength.

In Example 13, a particle mixture was obtained from the first metal particles made of CuSn as the first metal having an median particle diameter of 200 nm and the second metal particles made of an "Sn—58% by mass Bi" as a second metal having a median particle diameter of 25 μm (mass of the first metal particles: mass of the second metal particles=36:64). The mixture was mixed with a binder to prepare a paste-like bonding material. A bonded structure was formed in the same manner as in the above experiments, and the melting temperature and the bonding strength of the structure were measured.

The melting temperature of the bonding portion of the bonded structure is 340° C., and it is understood that the heat resistance is 300° C. or more. The bonding strength measured by a bond tester was 6.0 MPa, which means that it is a sufficient strength.

Also in Examples 14 to 25, the melting temperatures were 300° C. or more, and the bonding strengths were 6 MPa or more, which means that the bonding portions had sufficient performances. On the other hand, in Comparative Examples 4 and 5, the first metal particles and second metal particles were used which are the same as those of Examples 1 and 9 were used, but the mixing rations of the first metal particles are larger in both of the Comparative Examples. Although the melting temperature is sufficiently high as 500° C. or more, the bonding strengths are 1.4 MPa and 1.3 MPa, which are considerably smaller than those of Examples 1 and 9. The bonding material of Comparative Example 6 corresponds to the bonding material of Example 9 wherein the median particle diameter of the first metal particles is considerably larger compared with that in Example 9. The bonding strength is sufficiently large as 8 MPa or more, but the melting temperature is as low as 150° C., which is considerably lower than that in Example 9.

From these results, it is conceivable that when a bonding portion is formed with using a bonding material obtained by mixing the first metal particles having a median diameter of 1 μm or less of which a main component is Cu, and the second metal particles having a melting point lower than that of the first metal particles and having a median particle diameter of 5 μm or more, thus formed bonding portion is composed of the first metal portion containing Cu as a main component, the second metal portion derived from the second metal, containing at least one of In, Bi and Zn and having a melting point lower than that of the first metal portion, and the third metal portion containing, as a main component, CuSn as the intermetallic compound, having a melting point between the first metal portion and the second metal portion, and having the network structure, in which formed bonding portion the first metal portion is surrounded by the second metal portion or the third metal portion, and such second metal portion is also surrounded by the third metal portion. As a result, by the presence of the second metal particles having a lower melting point, the bonding portion can be formed only by heating at a relatively lower temperature for a short time, and the formed bonding portion has an improved heat resistance due to the network structure of the formed intermetallic compound.

When the bonding material of the present disclosure is used, the second metal particles are melted at a temperature of 200° C. or less upon soldering by a heating device, so that soldering is possible at a lower temperature (accordingly, in a shorter time period). As a result, in the bonding method for bonding an object using such bonding material, it is possible to reduce the energy consumption of the mounting process of the semiconductor device. Further, the formed bonding portion has the improved the heat resistance due to the network structure of the intermetallic compound (having a melting temperature higher than the second metal particles) formed by the first metal of the first metal particles which diffuses into the liquid phase formed by the molten second metal particles.

Thus, even when the bonding material of the present disclosure is used for bonding a semiconductor element which generates a large amount of heat such as a GaN semiconductor element, an SiC semiconductor element, or the like, deterioration of the reliability of the bonding portion is suppressed.

What is claimed is:

1. A bonding material which forms a bonding portion between two objects comprising:
   (1) first metal particles comprising a first metal and having a median particle diameter in the range of 20 nm to 1 μm, and
   (2) second metal particles comprising, as a second metal, at least one alloy of Sn and at least one element selected from the group consisting of Bi, In and Zn, and having a melting point of not higher than 200° C. and a median particle diameter in the range of 5 μm to 35 μm,
   wherein
   at least one metal element which forms the first metal forms at least one intermetallic compound with Sn derived from the second metal particles, and a melting point of the intermetallic compound is higher than that of the second metal particles and lower than that of the first metal particles, and
   a mixing ratio by mass of an amount of the first metal particles to a total amount of the first metal particles and the second metal particles is in the range of 36% to 70%.

2. The bonding material according to claim 1, wherein the first metal is at least one selected from the group consisting of (a) a simple metal of Ag, Cu, Fe, Ni and Sb, and (b) an alloy of Cu with at least one other metal.

3. The bonding material according to claim 2, wherein the first metal is at least one selected from the group consisting of Cu, a Cu—Sn alloy, a Cu—Ag alloy, a Cu—Ni, and a Cu—Sb alloy.

4. The bonding material according to claim 2, wherein the second metal is at least one selected from the group consisting of an Sn—In alloy, an Sn—Bi alloy and an Sn—Zn alloy.

5. The bonding material according to claim 2, wherein the first metal is Cu, the second metal is an Sn—In alloy, and an Sn—Cu intermetallic compound is formed.

6. A method of bonding two objects, comprising bonding the two objects with the bonding material according to claim 2.

7. The method of bonding two objects according to claim 6, comprising the steps of:
(1) supplying the bonding material to one of the objects to be bonded,
(2) placing the other object on the supplied bonding material so that the bonding material is located between the two objects,
(3) heating the bonding material and the objects to a temperature higher than the melting point of the second metal particles, and
(4) keeping such heating for a predetermined time followed by cooling.

8. The method of bonding two objects according to claim 7, wherein step (3) is performed by heating the bonding material and the objects to a temperature 20° C. higher than the melting point of the second metal particles.

9. A bonding portion formed by the bonding material according to claim 2.

10. The bonding material according to claim 1, wherein the first metal is at least one selected from the group consisting of Cu, a Cu—Sn alloy, a Cu—Ag alloy, a Cu—Ni, and a Cu—Sb alloy.

11. The bonding material according to claim 1, wherein the second metal is at least one selected from the group consisting of an Sn—In alloy, an Sn—Bi alloy and an Sn—Zn alloy.

12. The bonding material according to claim 1, wherein the first metal is Cu, the second metal is an Sn—In alloy, and an Sn—Cu intermetallic compound is formed.

13. A bonding portion formed by the bonding material according to claim 1.

14. A method of bonding two objects, comprising bonding the two objects with the bonding material according to claim 1.

15. The method of bonding two objects according to claim 14, comprising the steps of:
(1) supplying the bonding material to one of the objects to be bonded,
(2) placing the other object on the supplied bonding material so that the bonding material is located between the two objects,
(3) heating the bonding material and the objects to a temperature higher than the melting point of the second metal particles, and
(4) keeping such heating for a predetermined time followed by cooling.

16. The method of bonding two objects according to claim 15, wherein step (3) is performed by heating the bonding material and the objects to a temperature 20° C. higher than the melting point of the second metal particles.

* * * * *